(12) United States Patent
Mandal et al.

(10) Patent No.: US 7,215,175 B1
(45) Date of Patent: May 8, 2007

(54) FUSE SENSING SCHEME WITH AUTO CURRENT REDUCTION

(75) Inventors: Gurupada Mandal, Santa Clara, CA (US); Suresh Seshadri, Mountain View, CA (US); David Hugh McIntyre, Sunnyvale, CA (US); Raymond A. Heald, Los Altos, CA (US); William Y. Mo, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 80 days.

(21) Appl. No.: 10/932,162

(22) Filed: Sep. 1, 2004

(51) Int. Cl.
*H01H 37/76* (2006.01)
*H01H 85/00* (2006.01)

(52) U.S. Cl. .................................... 327/525
(58) Field of Classification Search ............... 327/525, 327/526; 365/225.7
See application file for complete search history.

(56) References Cited

U.S. PATENT DOCUMENTS

| | | | |
|---|---|---|---|
| 4,621,346 A | 11/1986 | McAdams | 365/227 |
| 4,687,951 A | 8/1987 | McElroy | 307/269 |
| 5,140,554 A | 8/1992 | Schreck et al. | 365/201 |
| 5,929,679 A * | 7/1999 | Ohwada | 327/206 |
| 6,157,241 A | 12/2000 | Hellums | 327/525 |
| 6,157,261 A | 12/2000 | Audoin et al. | 331/3 |
| 6,268,760 B1 | 7/2001 | Marshall et al. | 327/525 |
| 6,292,422 B1 | 9/2001 | Pitts | 365/225.7 |
| 6,384,664 B1 * | 5/2002 | Hellums et al. | 327/525 |
| 6,597,013 B2 | 7/2003 | Romas, Jr. et al. | 257/50 |
| 6,653,711 B1 | 11/2003 | Dhanasekaran et al. | 257/529 |
| 6,906,557 B1 * | 6/2005 | Parker et al. | 327/53 |
| 2005/0151578 A1 * | 7/2005 | Huang et al. | 327/525 |

* cited by examiner

*Primary Examiner*—Quan Tra
(74) *Attorney, Agent, or Firm*—Darby & Darby PC; M. David Ream

(57) ABSTRACT

An improved circuit for sensing and programming fuses in integrated circuits. The circuit is broadly comprised of a fuse cell, a reference circuit, a sense amplifier and a level detector. In one embodiment of the present invention, a two-stage sensing scheme is implemented. The improved fuse sensing circuit uses current-mode sensing and implements an auto-read current reduction scheme. Using a level-detect circuit, the virtual ground is raised automatically if the high-voltage power supply exceeds core supply (Vdd) by a fixed dc voltage. This reduces effective sensing voltage and the read current and thus helps preserve unblown fuse integrity. In one embodiment of the invention, four modes of operation are implemented: "Normal Read," "Unblown_Read," "Blown_Read_1" and "Blown_Read_2." The default read mode is the "normal read" while the "Unblown" and "Blown" read modes are for fuse calibration purposes. In the "Unblown_Read" read mode, the circuit is operable to compare the fuse resistance against a lower reference resistance, closer to an unblown fuse resistance value, in order to make the comparison more stringent. Similarly, the "Blown_Read_1" and "Blown_Read_2" modes allow a more stringent comparison for a blown fuse resistance.

20 Claims, 2 Drawing Sheets

FUSE SENSING SCHEME WITH AUTO CURRENT REDUCTION

BACKGROUND OF THE INVENTION

1. Field of the Invention

The present invention relates in general to the field of integrated circuits and, more specifically, to an improved circuit for sensing and programming fuses in integrated circuits.

2. Description of the Related Art

Fusible links, sometimes referred to as programmable fuses or "efuses," have found widespread use in integrated circuits. For example, programmable fuses can be used to store calibration information, encryption keys, "die ID" information and information for the configuration of optional features in the integrated circuit.

Large arrays of programmable fuses can also be used to make special purpose processors. For example, EPROM blocks in processors can be used to make power versus performance trade-offs by programming a mode bit. Another use for programmable fuses is to improve the yield of integrated circuit manufacturing processes. Designers often rely on redundant circuit components that can be made operable to replace defective components in an integrated circuit. When a defective component is detected, it is replaced with a redundant component by programming efuses in a fuse array.

In the examples discussed above, the fuse array must be read both during a testing procedure and during normal system operation. During these procedures, it is important to restrict the read current through an unblown fuse element in order to preserve its integrity. Since the process of programming or "blowing" a fuse occurs at a much higher voltage than the normal operation voltage, the control circuitry needs to operate robustly over a large voltage range. Furthermore, to calibrate the quality of the blown or unblown fuse, different sensing modes are required, thereby necessitating a dynamic mode-based threshold for the sensing scheme. A conventional voltage sensing scheme generally is not satisfactory given the constraints described above.

To ensure the quality of blown/unblown fuses, the fuses need to be read out during the test procedure (at a higher supply voltage) so that they can be re-programmed if necessary. However, at a higher supply voltage, the current through an unblown fuse can be large enough to partially program the fuse and increase the fuse resistance. This can make the fuse "stubborn" and unprogrammable. Also, such an effect is cumulative, i.e., it would depend on the number of times the fuse is read-out before programming it.

In view of the foregoing, there is a need for an improved sensing circuit for use in conjunction with programmable fuses used in integrated circuits. Such an improved circuit is provided by the method and apparatus of the present invention, as described hereinbelow.

SUMMARY OF THE INVENTION

The method and apparatus of the present invention overcomes the shortcomings of the prior art by providing an improved circuit for sensing and programming fuses in integrated circuits. The circuit implemented in the method and apparatus of the present invention is broadly comprised of a fuse cell, a reference circuit, a sense amplifier and a level detector. The present invention can be implemented in one or more stages. In one embodiment of the present invention, a two-stage sensing scheme is implemented for timing reasons. The first stage comprises a current mirror with one half of the current mirror in the reference circuit and the other half in the sense amplifier. The second stage comprises a differential amplifier in the sense amplifier module, as described in greater detail below.

In the present invention, the improved fuse sensing circuit uses current-mode sensing and implements an auto-read current reduction scheme. Using a level-detect circuit, the virtual ground is raised automatically if the high-voltage power supply exceeds core supply ($V_{core}$) by a fixed dc voltage (a function of the thick oxide PMOS transistor threshold voltage $V_{thox,P}$). This reduces effective sensing voltage and the read current and thus helps preserve unblown fuse integrity.

In the method and apparatus of the present invention, there are four different modes of operation—"Normal Read," "Unblown_Read," "Blown_Read_1" and "Blown_Read_2." The default read mode is the "Normal Read" while the "Blown" and "Unblown" read modes are for fuse verification purposes. In the "Unblown_Read" read mode, the circuit is operable to compare the fuse resistance against a lower reference resistance, closer to an unblown fuse resistance value, in order to make the comparison more stringent. Similarly, the purpose of "Blown_Read_1" and "Blown_Read_2" modes is to make a more stringent comparison for a blown fuse resistance.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
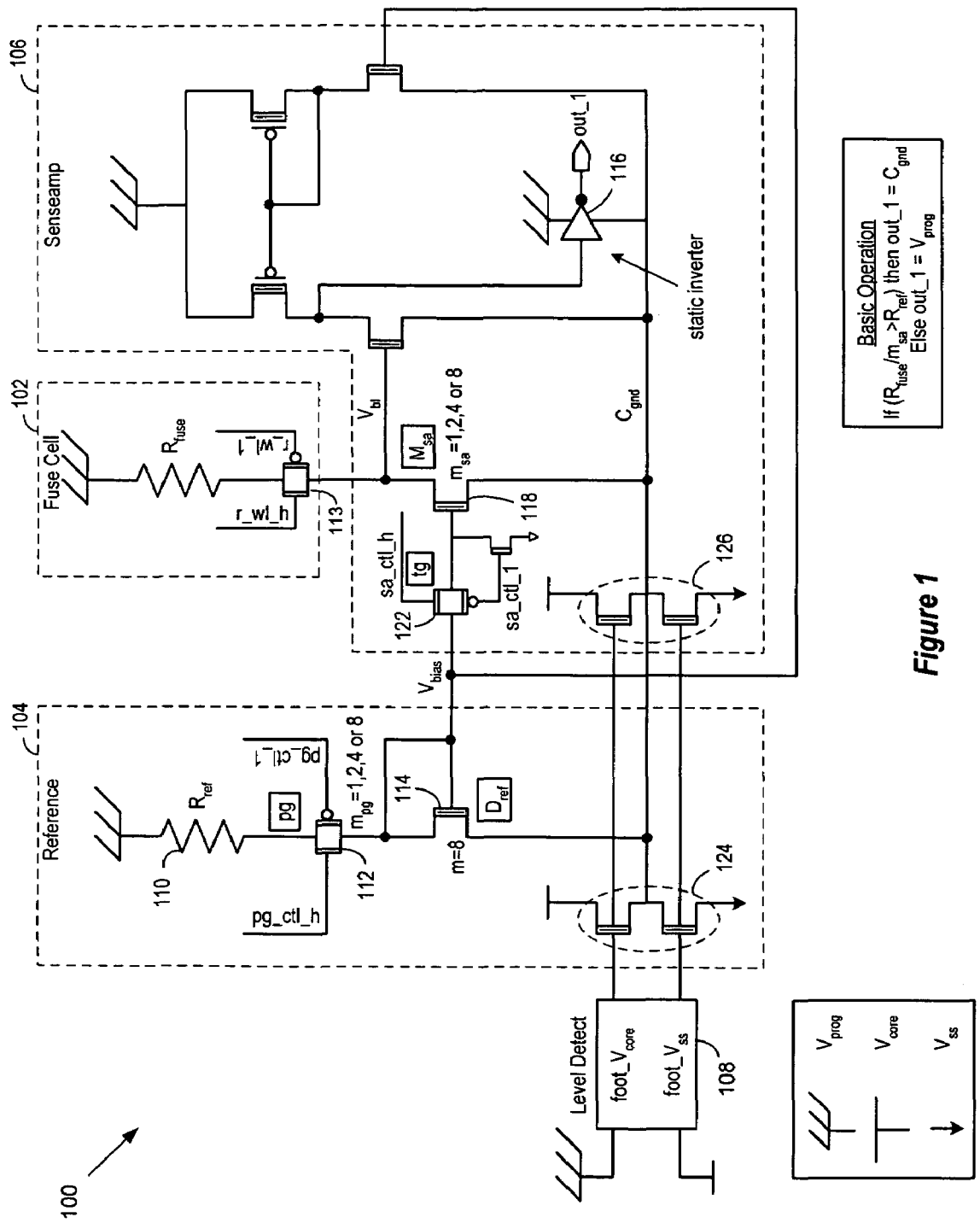
FIG. 1 is a schematic illustration of a fuse sensing circuit with auto-current reduction in accordance with the present invention.

The method and apparatus of the present invention is implemented using the circuit 100 shown in FIG. 1. The circuit 100 is broadly comprised of a fuse cell 102, a reference circuit 104, a sense amplifier 106 and a level detector 108. In the method and apparatus of the present invention, a two-stage scheme is implemented. The first stage comprises a current mirror with one half of the current sensing mirror in the reference circuit 104 and the other half in the sense amplifier 106. The second stage is a four-transistor differential amplifier in the sense amplifier module 106, as described in greater detail below.

The reference circuit 104 sets the reference voltage ($V_{bias}$) for a given supply voltage ($V_{prog}$). The mode setting and the sense amplifier 106 serve to translate the fuse resistance into the bitline voltage level ($V_{b1}$). Subsequently, the differential between the two levels ($V_{bias}$, and $V_{b1}$) is detected by the differential amplifier in the sense amplifier module 106.

Referring again to FIG. 1, the reference circuit 104 is comprised of four parts—reference resistor 110, pass gates 112, diode-connected transistor ($D_{ref}$) 114 (half current mirror), and margin controls, discussed hereinbelow. In one embodiment of the invention, the reference resistor ($R_{ref}$) comprises a 2.0 K-ohm n-well resistor. In other embodiments of the invention, an actual fuse can be used for a more accurate reference. The reference is normalized to different values by using the current multiplier for different "margin read" modes. For example, in the "Unblown_Read," the current on the bitline and reference sides are equal and, therefore, the threshold resistance, the effective resistance the fuse is being compared against, is equal to the reference resistance Those of skill in the art will appreciate that the method and apparatus of the present invention can be implemented using a variety of modes. In one embodiment of the invention, four modes are implemented: 1) "Normal Read;" 2) "Unblown_Read;" 3) "Blown_Read_1;" and 4) "Blown_Read_2." The default read mode is the "Normal Read" while the "Blown" and Unblown" read modes are for fuse calibration purposes. In the "Unblown_Read" read mode, the circuit is operable to compare the fuse resistance against a lower threshold resistance, closer to an unblown fuse resistance value, in order to make the comparison more stringent. Similarly, the purpose of "Blown_Read_1" and "Blown_Read_2" modes is to make a more stringent comparison for a blown fuse resistance.

For purposes of discussion, the features of the method and apparatus can be analyzed by assuming initially that the reference/bias voltages of the circuit 100 for the different read modes are the same. For "Unblown_Read," the current mirror multiplier is 1; i.e., the current on the bitline ($I_{b1}$) and reference ($I_{ref}$) legs are equal. Hence, if the fuse resistance (ignoring b1 resistance) is equal to the reference resistance (e.g., 2.0 K-ohm), the voltage on the bitline would be equal to the reference voltage. Any value of fuse resistance less than 2.0 K-ohm would result in a higher voltage on the bitlines and would yield a '1' at the output of the inverter 116 (after the differential amplifier).

For "normal read," the current mirror multiplier is ½; i.e., the current on the b1 line is one-half the current on the reference line. In this case, the DC threshold resistance is approximately 4 K-ohm. For "Blown_Read_1" and "Blown_Read_2," the current mirror multipliers are ¼ and ⅛, respectively. The DC threshold resistance for "Blown_Read_1" and "Blown_Read_2" are approximately 8 K-ohm and 16 K-ohm, respectively.

Pass gates 112 in the reference cell are used to compensate for the effect of the pass gate 113 in the fuse cell 102 and also for error correction purposes. In the reference cell 104, the number of transistors, m, for reference transistor 114 is always equal to 8, a fixed value. In the senseamp cell 108, the number of transistors, $m_{sa}$ for the transistor device 118, may be chosen to be 1, 2, 4, or 8 by selecting a given margin read mode.

As discussed above, varying the number of pass gates 112 turned-on in the reference circuit 104 controls the various "margin reads." For "Blown_Read_2," eight of the pass gates are turned on; for "Blown_Read_1," four of the pass gates are turned on; for "normal read," two of the pass gates are turned on; and for "Unblown_Read," one of the pass gates is turned on. This is the inverse of the multiplier $M_{sa}$ 118 implemented in the sense amplifier module 106, discussed below. The diode-connected transistor ($D_{ref}$) 114 is comprised of eight legs of 1.00 u/0.78 u in a diode-connected configuration to implement one-half of the current mirror.

Implementation of the method and apparatus of the present invention can be understood by considering the case where msa is equal to 1. The resistance in the fuse cell 104 is (Rfuse+Rpg). Since m=8 and msa=1, the current on the reference side ($I_{ref}$) is eight times the current on the bitline side ($I_{b1}$). This means that the effective resistance in the reference cell will be ($8*R_{ref}+8*R_{pg}$) if mpg=1. However, choosing mpg=8, instead of mpg=1, there will be 8 pass gates in parallel, and the effective resistance on the reference side will be ($8*R_{ref}+R_{pg}$). Thus the effective resistance of the pass gates on the reference side is equal to the resistance of the pass gate on the fuse side. Therefore, the voltage drop across the pass gate in the reference cell will be equal to the voltage drop across the pass gate in the fuse cell. Other modes (for msa=2, 4, or 8) are handled similarly by a corresponding choice of mpg. To be specific: if msa=1, mpg=8; if msa=2, mpg=4; if msa=4, mpg=2; if msa=8, mpg=1. Although the example discussed above uses a monotonically increasing ratio of 1:2:4:8, it will be understood by those of skill in the art that other monotonically increasing ratios, such as 1:3:9:27, can be used within the scope of the present invention.

The sense amplifier 106 is comprised of three main parts—a current multiplier $m_{SA}$ 118 (the other half of the current mirror), a differential amplifier, and transmission gates (tg) 122. The transmission gates 122 control whether a voltage equal to $V_{ref}$ or $V_{SS}$ (ground) needs to be placed on the gates of the current multiplier transistors $m_{SA}$ for margin read purposes. As described above, depending on the margin read, a varying number of legs of the current multiplier $m_{sa}$ are connected to the output of the fuse cell 102. For "Unblown_Read," eight legs are connected ($I_{ref}=I_{b1}$); for "normal read," four legs are connected ($I_{ref}/2=I_{b1}$); for "Blown_Read_1," two legs are connected ($I_{ref}/4=I_{b1}$) and for "Blown_Read_2," one leg is connected ($I_{ref}/8=I_{b1}$).

The difference between the fuse resistance in its blown or unblown state and the equivalent reference resistance results in a voltage differential between the reference and bitline. The differential amplifier amplifies this voltage differential compared to rail voltage. An unblown fuse is sensed as a '0' and a blown resistance as a '1.'

As discussed above, the operation of programming or "blowing" a fuse is performed at much higher voltage than regular operation of the circuit. To preserve the integrity of the fuse after multiple reads it is necessary to restrict the read current through an unblown fuse at elevated sensing supply voltage.

Figure 2:
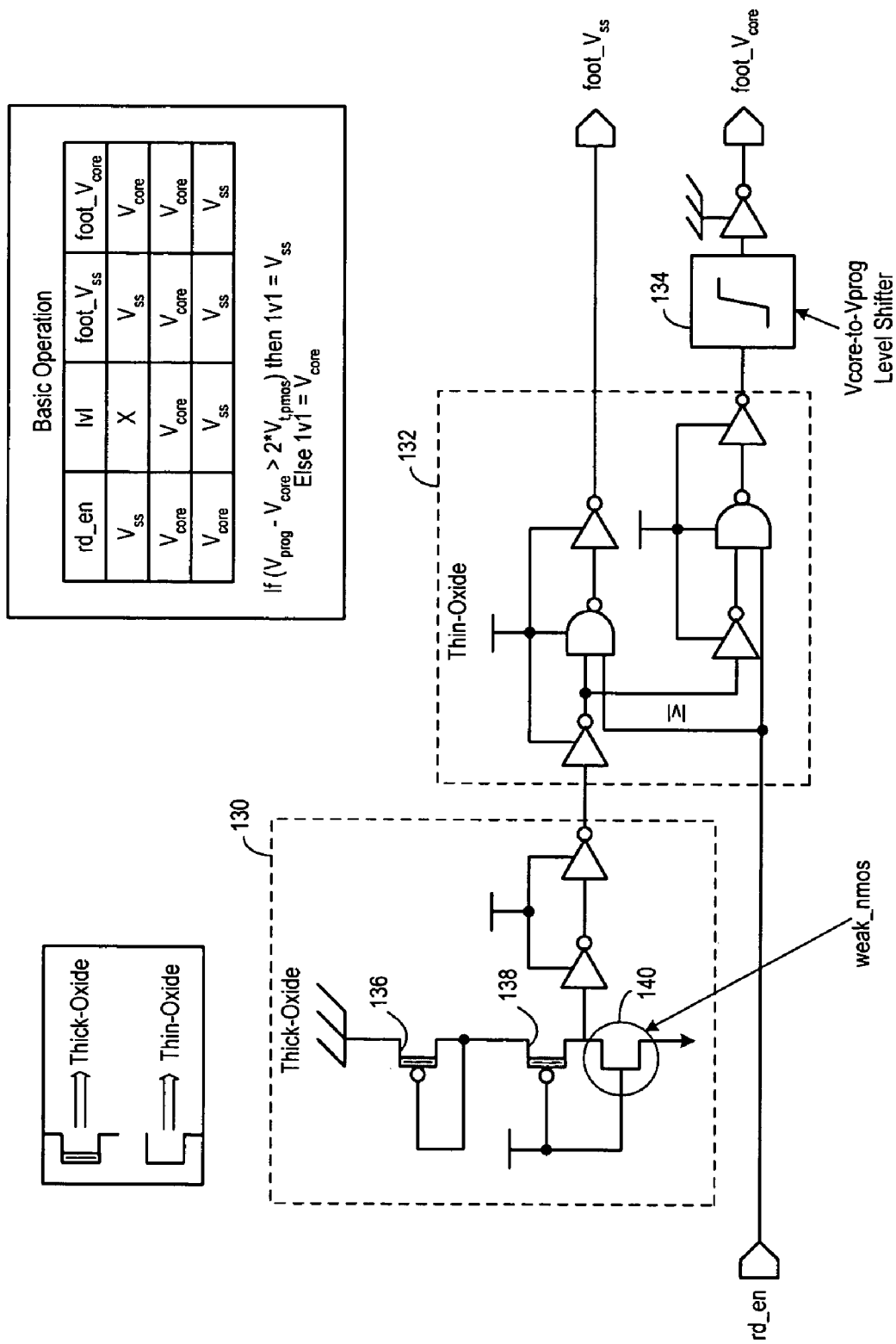
FIG. 2 is an illustration of level detection circuit used in the method and apparatus for fuse sensing with auto-current reduction in accordance with the present invention.

The level detector 108, illustrated in FIG. 2, is broadly comprised of a thick oxide logic module 130, a thin oxide logic module 132 and a $V_{core}$-to-$V_{prog}$ level shifter 134. The thick oxide logic module comprises thick oxide p-mos transistors 136 and 138 and a weak n-mos transistor 140. The weak n-mos transistor 140 operates as a weak pull down transistor which may be implemented by an appropriate number of NMOS transistors connected in series. The footer outputs serve two functions 1) to elevate the virtual ground level when the sensing supply voltage is higher than core voltage by at least $2*V_{thox,p}$ to reduce the read current, as discussed below, and 2) to shut off the reference circuit 104 when not in use (i.e., no read operation is being performed), to save power.

There are two supply voltages of interest: 1) the "programming voltage," $V_{prog}$>$V_{core}$ (Higher voltage when programming the fuses); and 2) the "supply voltage" outside the high voltage region, $V_{core}$ (during normal operation).

Table 1 is a logic table illustrating states of the level detector 108

TABLE 1

| | Level Detect Logic | | |
|---|---|---|---|
| rd_en | lvl | foot_$V_{ss}$ | foot_$V_{core}$ |
| 0 | X | 0 | 1 |
| 1 | 1 | 1 | 0 |
| 1 | 0 | 0 | 1 |

The footer devices 124 and 126 in the reference circuit 104 and the sense amplifier 106, respectively, are controlled by the level detect circuit 108. The footer devices 124 and 126 serve to elevate the virtual ground when in programming mode, i.e., $V_{prog}$ is connected to a higher voltage. The controls for the footer device are generated by a level detect circuit, illustrated in FIG. 2, which detects the difference between $V_{prog}$ and $V_{core}$. If $V_{prog}$ is greater by at least $2*V_{thox,p}$ then virtual ground level is equal to $V_{core}$. Otherwise, the virtual ground level is equal to $V_{SS}$. The level detect circuit 108 raises the virtual ground voltage, the effective sensing supply voltage is ($V_{prog}$-$V_{core}$), thereby considerably reducing the read current for an unblown fuse.

Based on the allowable read current, $V_{core}$ voltage value may be varied for a given $V_{prog}$ voltage. Table 2 shows the level detect o/p matrix for different values of $V_{prog}$ and $V_{core}$: "L/H indicates the gray zone for the level detect circuit i.e., the o/p could go either high or low based on process variation.

TABLE 2

| | Vdd | | | | | | | | | |
|---|---|---|---|---|---|---|---|---|---|---|
| Vpp | 0.6 | 0.7 | 0.8 | 0.9 | 1.0 | 1.1 | 1.2 | 1.3 | 1.4 | 1.5 |
| 1.5 | H | L/H | L/H | L/H | L | L | L | L | L | L |
| 1.6 | H | H | L/H | L/H | L | L | L | L | L | L |
| 1.7 | H | H | L/H | L/H | L/H | L | L | L | L | L |
| 1.8 | H | H | H | L/H | L/H | L/H | L | L | L | L |
| 1.9 | H | H | H | H | L/H | L/H | L/H | L | L | L |
| 2.0 | H | H | H | H | H | L/H | L/H | L/H | L | L |
| 2.1 | H | H | H | H | H | L/H | L/H | L/H | L/H | L |
| 2.2 | H | H | H | H | H | H | L/H | L/H | L/H | L/H |
| 2.3 | H | H | H | H | H | H | H | L/H | L/H | L/H |
| 2.4 | H | H | H | H | H | H | H | H | L/H | L/H |
| 2.5 | H | H | H | H | H | H | H | H | H | L/H |
| 2.6 | H | H | H | H | H | H | H | H | H | H |
| 2.7 | H | H | H | H | H | H | H | H | H | H |

Thus, the most predictable results are obtained by operating outside the gray zone (L/H zone), i.e., either in "L" or "H" zone. Tables 3 and 4 show the read current for the cases when the virtual ground is connected to $V_{SS}$ and $V_{core}$ respectively. The currents in Tables 3 and 4 are for Unblown_Read which is the worst-case read mode for read current purposes. The various examples of voltages, e.g., $V_{core}$ and $V_{prog}$, discussed herein are for a specific process, such as a 90 nm process. It will be understood by those of skill in the art that other voltage levels can be used for other processes within the scope of the present invention.

TABLE 3

| Vpp | Iunblown | Vpp | Iunblown |
|---|---|---|---|
| 0.6 | 15 | 1.3 | 178 |
| 0.7 | 30 | 1.4 | 212 |
| 0.8 | 49 | 1.5 | 247 |
| 0.9 | 70 | 1.6 | 283 |
| 1.0 | 92 | 1.7 | 318 |
| 1.1 | 117 | | |
| 1.2 | 145 | | |

TABLE 4

$I_{read}$ Matrix(@ffxn) (For $C_{gnd} = V_{core}$Mode) in uA

| Vpp | Vdd | | | | | | | | | |
|---|---|---|---|---|---|---|---|---|---|---|
| | 0.6 | 0.7 | 0.8 | 0.9 | 1.0 | 1.1 | 1.2 | 1.3 | 1.4 | 1.5 |
| 1.5 | 72 | (56) | (L) | L | L | L | L | L | L | L |
| 1.6 | 91 | 76 | (57) | (L) | L | L | L | L | L | L |
| 1.7 | 111 | 96 | (78) | (57) | (L) | L | L | L | L | L |
| 1.8 | 131 | 117 | 99 | (78) | (55) | (L) | L | L | L | L |
| 1.9 | 152 | 139 | 121 | 100 | (77) | (54) | (L) | L | L | L |
| 2.0 | 174 | 161 | 143 | 122 | 99 | (76) | (52) | (L) | L | L |
| 2.1 | 196 | 183 | 166 | 145 | 123 | (98) | (74) | (50) | (L) | L |
| 2.2 | 218 | 106 | 189 | 169 | 146 | 122 | (97) | (72) | (L) | (L) |
| 2.3 | 242 | 229 | 213 | 193 | 170 | 146 | 121 | (95) | (70) | (L) |
| 2.4 | 266 | 254 | 237 | 217 | 194 | 170 | 145 | 119 | (93) | (68) |
| 2.5 | 292 | 279 | 262 | 241 | 219 | 195 | 170 | 144 | 118 | (91) |
| 2.6 | 318 | 305 | 288 | 267 | 244 | 220 | 195 | 169 | 142 | 116 |
| 2.7 | 345 | 333 | 315 | 294 | 270 | 245 | 220 | 194 | 168 | 141 |

The method of the present invention can be implemented by the following processing steps:

Step 1: Find the programming voltage, $V_{prog}$.

Step 2: Find the allowable fuse read current. Identify the range of $V_{core}$ allowable values of $V_{core}$ for a given $V_{prog}$ such that $I_{read} < I_{max}$ identified in Step 1 using Table 4.

Step 3: Based on Step 1 and Step 2, find a value of $V_{core}$ from Table 2 such that the level detect output lies outside the "L/H" zone.

Step 4: During normal operation when $V_{prog} = V_{core}$, use Table 3 for finding the fuse read current.

In alternate embodiments, the present invention can be used for "per-die" information stored (in fuses) on a chip, including but not limited to the "die ID," calibration information, encryption keys, and information for the configuration of optional features in the integrated circuit.

While the present invention has been described in detail, it should be understood that the figures and the related description are for illustration purposes only and should not be taken as limitations upon the present invention. For example, as will be understood by those of skill in the art, thin-oxide transistors can be used in place of the thick-oxide transistors in the level detector circuit described hereinabove. In addition, the number of read modes described herein can be modified based on the level of accuracy needed for fuse verification. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A system for programming fuses in integrated circuits, comprising:
   a fuse cell;
   a reference circuit;
   a sense amplifier; and
   a level detector operable to control current through said fuse cell;
   wherein said reference circuit and said sense amplifier are operable to implement a sensing scheme comprising first and second stages, said first stage comprising current-mode sensing and said second stage comprising auto-read current reduction;
   wherein said fuse cell comprises a fuse having a predetermined resistance, said fuse being connected to a supply voltage ($V_{prog}$), wherein said fuse cell is operable to generate a bitline voltage ($V_{b1}$) as a function of said supply voltage and said resistance of said fuse; and
   wherein said reference circuit and said sense amplifier are connected to a virtual ground and wherein said level detector is operable to automatically raise the voltage level of said virtual ground if said supply voltage ($V_{prog}$) exceeds a predetermined DC voltage level.

2. The system of claim 1, wherein said first stage comprises a current mirror and wherein a portion of said current mirror is in said reference circuit and a portion of said current mirror is in said sense amplifier.

3. The system of claim 2, wherein said second stage comprises a differential amplifier in said sense amplifier module.

4. The system according to claim 3, wherein said sense amplifier module further comprises a current multiplier and a plurality of transmission gates.

5. A system for programming fuses in integrated circuits, comprising:
   a fuse cell;
   a level detector;
   a reference circuit, comprising;
      a reference resistor connected to a supply voltage ($V_{prog}$);
      a plurality of pass gates; and
      a plurality of margin controls;
      wherein said reference resistor is normalized to a plurality of values in response to said margin controls and said reference circuit generates a reference voltage ($V_{bias}$) as function of said supply voltage and said normalized resistance;
   a sense amplifier comprising a current multiplier and a plurality of transmission gates;
   wherein said reference circuit and said sense amplifier are operable to implement a sensing scheme comprising first and second stapes, said first stage comprising current-mode sensing and said second stage comprising auto-read current reduction;

wherein said first stage comprises a current mirror and wherein a portion of said current mirror is in said reference circuit and a portion of said current mirror is in said sense amplifier wherein said second stage comprises a differential amplifier in said sense amplifier module.

6. The system of claim 5, wherein said fuse cell comprises:
- a fuse having a predetermined resistance, said fuse being connected to said supply voltage ($V_{prog}$),
- a fuse pass gate, and
- wherein said fuse cell is operable to generate a bitline voltage ($V_{b1}$) as a function of said supply voltage and said resistance of said fuse.

7. The system according to claim 5 or claim 6, wherein said reference circuit and said sense amplifier are connected to a virtual ground and wherein said level detector is operable to automatically raise the voltage level of said virtual ground if said supply voltage ($V_{prog}$) exceeds a predetermined DC voltage level.

8. The system according to claim 7, wherein said differential amplifier is operable to detect the differential between said reference voltage ($V_{bias}$) and said bitine voltage ($V_{b1}$) and to generate control signals in response thereto.

9. The system of claim 8, wherein said system is operable to operate in a plurality of margin modes.

10. The system according to claim 9, wherein predetermined combinations of said pass gates in said reference circuit are activated to generate normalization ratios for said plurality of margin read modes.

11. The system according to claim 10, wherein said sense amplifier module comprises a plurality of multiplier gates and wherein predetermined combinations of said multiplier gates are activated as an inverse ratio of said combinations of said pass gates activated in said reference circuit.

12. The system according to claim 11, wherein one of said plurality of margin modes comprises a normal read mode wherein two of said pass gates in said reference circuit are activated.

13. The system of claim 11, wherein one of said plurality of margin modes comprises an unblown read mode wherein the system is operable to compare the resistance of a fuse to a reference resistance corresponding to an unblown fuse.

14. The system according to claim 13, wherein one of said pass gates in said reference circuit is turned on for said unblown read mode.

15. The system according to claim 11, wherein said plurality of margin modes comprises first and second blown read modes wherein the value of the resistance of a fuse is compared to a known resistance value corresponding to a blown fuse.

16. The system according to claim 15, wherein four of said pass gates in said reference circuit are activated when operating in said first blown read mode.

17. The system according to claim 15, wherein eight of said pass gates in said reference circuit are activated when operating in said second blown read mode.

18. A method for programming fuses in integrated circuits, comprising:
- using a reference circuit to provide a reference voltage to generate a current in a fuse cell;
- using a sense amplifier to measure current in said fuse cell; and
- using a level detector to control the current through said fuse cell;
- wherein said reference circuit and said sense amplifier are operable to implement a sensing scheme comprising first and second stages, said first stage comprising current-mode sensing and said second stage comprising auto-read current reduction;
- wherein said fuse cell comprises a fuse having a predetermined resistance, said fuse being connected to a supply voltage ($V_{prog}$), said fuse cell generating a bitline voltage ($V_{b1}$) as a function of said supply voltage and said resistance of said fuse; and
- wherein said reference circuit and said sense amplifier are connected to a virtual ground, said level detector automatically raising the voltage level of said virtual ground if said supply voltage ($V_{prog}$) exceeds a predetermined DC voltage level.

19. The method of claim 18, wherein said first stage comprises a current mirror and wherein a portion of said current mirror is in said reference circuit and a portion of said current mirror is in said sense amplifier.

20. The method of claim 19, wherein said second stage comprises a differential amplifier in said sense amplifier module.

* * * * *